(12) United States Patent
Grantham et al.

(10) Patent No.: US 8,405,982 B2
(45) Date of Patent: Mar. 26, 2013

(54) METHOD AND APPARATUS FOR INSTALLATION AND REMOVAL OF OVERHEAD COOLING EQUIPMENT

(75) Inventors: Roy Grantham, O'Fallon, MO (US); Kevin Lemke, Arnold, MO (US)

(73) Assignee: Schneider Electric IT Corporation, West Kingston, RI (US)

( * ) Notice: Subject to any disclaimer, the term of this patent is extended or adjusted under 35 U.S.C. 154(b) by 128 days.

(21) Appl. No.: 13/108,761

(22) Filed: May 16, 2011

(65) Prior Publication Data

US 2011/0299242 A1  Dec. 8, 2011

Related U.S. Application Data

(63) Continuation of application No. 12/483,408, filed on Jun. 12, 2009, now Pat. No. 7,944,692.

(51) Int. Cl.
*H05K 7/20* (2006.01)

(52) U.S. Cl. ........ 361/688; 361/699; 361/694; 361/695; 361/701; 454/184

(58) Field of Classification Search ........................ None
See application file for complete search history.

(56) References Cited

U.S. PATENT DOCUMENTS

| | | |
|---|---|---|
| 1,680,092 A | 8/1928 | Dixson |
| 2,060,582 A | 11/1936 | Leffert |
| 3,545,224 A | 12/1970 | Nicoski et al. |
| 3,791,089 A | 2/1974 | Alderman |
| 4,063,431 A | 12/1977 | Dankowski |
| 4,083,245 A | 4/1978 | Osborn |
| 4,138,857 A | 2/1979 | Dankowski |
| 5,028,087 A | 7/1991 | Ells |
| 5,259,206 A | 11/1993 | Dankowski |
| 5,279,360 A | 1/1994 | Hughes et al. |
| 5,341,870 A | 8/1994 | Hughes et al. |
| 5,533,259 A | 7/1996 | Hughes et al. |
| 5,879,232 A | 3/1999 | Luter, II et al. |
| 5,924,300 A | 7/1999 | Fromm et al. |
| 6,034,873 A | 3/2000 | St.ang.hl et al. |
| 6,199,337 B1 | 3/2001 | Colson et al. |
| 6,315,525 B1 | 11/2001 | Webb |

(Continued)

FOREIGN PATENT DOCUMENTS

| | | |
|---|---|---|
| CN | 1521591 A | 8/2004 |
| DE | 20014274 U1 | 11/2000 |

(Continued)

OTHER PUBLICATIONS

"Inter-Rack Flow Seperator to Prevent Computer Rack Hot Exhaust Air Entry into Cold Region at Rack Inlet of Computer Data Center Facilities" IP.Com Journal, IP.Com Inc., West Henrietta, NY, US, Jun. 20, 2006, XP013114636 ISSN: 1533-0001.

(Continued)

*Primary Examiner* — Gregory Thompson
(74) *Attorney, Agent, or Firm* — Lando & Anastasi, LLP

(57) ABSTRACT

Disclosed is a data center comprising a first row of equipment racks, a second row of equipment racks, a hot aisle defined by a space between the first row of equipment racks and the second row of equipment racks, and a track system above the hot aisle of the data center upon which cooling units may be mounted. Cooling units may be moved along the track system. The track system may include portions of track secured to the top sides of one or more cooling units. Also disclosed is a method for installing a cooling unit above a hot aisle of a data center including a plurality of equipment racks.

20 Claims, 15 Drawing Sheets

U.S. PATENT DOCUMENTS

| | | | |
|---|---|---|---|
| 6,343,011 B1 | 1/2002 | Yu | |
| 6,668,565 B1 | 12/2003 | Johnson et al. | |
| 6,672,955 B2 | 1/2004 | Charron | |
| 6,732,789 B2 | 5/2004 | Jang | |
| 6,859,366 B2 | 2/2005 | Fink | |
| 6,880,349 B2 | 4/2005 | Johnson et al. | |
| 6,967,283 B2 | 11/2005 | Rasmussen et al. | |
| 6,980,433 B2 | 12/2005 | Fink | |
| 7,046,514 B2 | 5/2006 | Fink et al. | |
| 7,140,193 B2 | 11/2006 | Johnson et al. | |
| 7,145,772 B2 | 12/2006 | Fink | |
| 7,165,412 B1 | 1/2007 | Bean, Jr. | |
| 7,173,820 B2 | 2/2007 | Fink et al. | |
| 7,259,963 B2 | 8/2007 | Germagian et al. | |
| 7,278,273 B1 | 10/2007 | Whitted et al. | |
| 7,293,666 B2 | 11/2007 | Mattlin et al. | |
| 7,297,022 B2 | 11/2007 | Pearce | |
| 7,325,410 B1 | 2/2008 | Bean, Jr. | |
| 7,372,695 B2 | 5/2008 | Coglitore et al. | |
| 7,403,391 B2 | 7/2008 | Germagian et al. | |
| 7,430,118 B1 | 9/2008 | Noteboom et al. | |
| 7,508,663 B2 | 3/2009 | Coglitore | |
| 7,508,666 B1 | 3/2009 | Henneberg et al. | |
| 7,511,960 B2 | 3/2009 | Hillis et al. | |
| 7,551,971 B2 | 6/2009 | Hillis | |
| 7,611,327 B2 | 11/2009 | Holston et al. | |
| 7,643,285 B2 | 1/2010 | Nishiyama et al. | |
| 7,646,590 B1 * | 1/2010 | Corhodzic et al. | 361/641 |
| 7,724,518 B1 * | 5/2010 | Carlson et al. | 361/679.53 |
| 7,800,900 B1 * | 9/2010 | Noteboom et al. | 361/679.47 |
| 7,856,838 B2 * | 12/2010 | Hillis et al. | 62/259.2 |
| 7,916,470 B2 | 3/2011 | Mills et al. | |
| 7,944,692 B2 | 5/2011 | Grantham et al. | |
| 7,957,142 B2 | 6/2011 | Noteboom et al. | |
| 7,990,710 B2 | 8/2011 | Hellriegel et al. | |
| 8,031,468 B2 | 10/2011 | Bean, Jr. et al. | |
| 8,184,435 B2 | 5/2012 | Bean, Jr. et al. | |
| 8,251,785 B2 * | 8/2012 | Schmitt et al. | 454/184 |
| 8,305,757 B2 * | 11/2012 | Keisling et al. | 361/699 |
| 2003/0050003 A1 | 3/2003 | Charron | |
| 2004/0184232 A1 | 9/2004 | Fink | |
| 2005/0011637 A1 | 1/2005 | Takano | |
| 2005/0209740 A1 | 9/2005 | Vann | |
| 2005/0280986 A1 | 12/2005 | Coglitore et al. | |
| 2006/0260338 A1 | 11/2006 | VanGilder et al. | |
| 2006/0283111 A1 | 12/2006 | Ayers et al. | |
| 2007/0084589 A1 | 4/2007 | Nishino et al. | |
| 2007/0146994 A1 | 6/2007 | Germagian et al. | |
| 2007/0167125 A1 | 7/2007 | Rasmussen et al. | |
| 2007/0262606 A1 | 11/2007 | Schnoblen et al. | |
| 2008/0043426 A1 | 2/2008 | Nishiyama et al. | |
| 2008/0055850 A1 | 3/2008 | Carlson et al. | |
| 2008/0060372 A1 | 3/2008 | Hillis et al. | |
| 2008/0141525 A1 | 6/2008 | Breiding et al. | |
| 2008/0185446 A1 | 8/2008 | Tozer | |
| 2008/0291626 A1 | 11/2008 | Nelson et al. | |
| 2009/0014397 A1 | 1/2009 | Moss et al. | |
| 2009/0025418 A1 | 1/2009 | De La Cruz et al. | |
| 2009/0046427 A1 | 2/2009 | Noteboom et al. | |
| 2009/0086428 A1 * | 4/2009 | Campbell et al. | 361/694 |
| 2009/0241578 A1 * | 10/2009 | Carlson et al. | 62/259.2 |
| 2009/0251860 A1 | 10/2009 | Belady et al. | |
| 2009/0255653 A1 * | 10/2009 | Mills et al. | 165/104.34 |
| 2009/0319650 A1 | 12/2009 | Collins et al. | |
| 2010/0061057 A1 | 3/2010 | Dersch et al. | |
| 2010/0111698 A1 | 5/2010 | Wiedeman et al. | |
| 2010/0144265 A1 | 6/2010 | Bednarcik et al. | |
| 2010/0188816 A1 | 7/2010 | Bean, Jr. et al. | |
| 2010/0190430 A1 | 7/2010 | Rodriguez et al. | |
| 2010/0230058 A1 | 9/2010 | Mahoney | |
| 2010/0263830 A1 | 10/2010 | Noteboom et al. | |
| 2010/0300648 A1 | 12/2010 | Grantham | |
| 2010/0307716 A1 | 12/2010 | Bean, Jr. et al. | |
| 2010/0329885 A1 | 12/2010 | Criner et al. | |
| 2011/0108207 A1 | 5/2011 | Mainers et al. | |
| 2012/0012283 A1 | 1/2012 | Bean, Jr. et al. | |

FOREIGN PATENT DOCUMENTS

| | | |
|---|---|---|
| DE | 20 2004 003309 U1 | 8/2004 |
| DE | 202008010718 U1 | 2/2009 |
| EP | 0033182 A2 | 8/1981 |
| EP | 1 069 381 A1 | 1/2001 |
| EP | 1448040 A2 | 8/2004 |
| FR | 2949641 A1 | 3/2011 |
| JP | 2003-166729 A | 6/2003 |
| JP | 2005260148 A | 9/2005 |
| JP | 2007316989 A | 12/2007 |
| JP | 2009097774 A | 5/2009 |
| JP | 2010122747 A | 6/2010 |
| SE | 456449 B | 10/1988 |
| WO | 9963797 A1 | 12/1999 |
| WO | 2007090804 A2 | 8/2007 |

OTHER PUBLICATIONS

American Power Conversion Corporation Brochure, "Hot Aisle Containment System (HACS)," 2008, pp. 1-68.

APC's InfraStruXure(R) Hot-Aisle Containment Systems a Key to Sun's New Energy Efficient Data Center, Press release of American Power Conversion Corporation, West Kingston, R.I., Oct. 16, 2007.

International Search Report for PCT/US2009/053759 mailed Apr. 9, 2010.

International Search Report for PCT/US2009/068506 mailed Apr. 8, 2010.

International Search Report for PCT/US2010/035092 dated Aug. 31, 2010.

International Search Report for PCT/US2010/035212 mailed Feb. 8, 2011.

International Search Report for PCT/US2010/035418 mailed Aug. 17, 2010.

Invitation to Pay Additional Fees and Partial International Search Report for PCT/US2009/053759 mailed Nov. 16, 2009.

Invitation to Pay Additional Fees and Partial International Search Report for PCT/US2010/035212 mailed Oct. 5, 2010.

Rotheroe et al., "Hot Aisle Based Heat Removal Unit", RD545030, Hewlett-Packard Co., Sep. 2009.

Stahl et al., "Designing an Alternative to Conventional Room Cooling", Interlec 2001, Oct. 2001, pp. 109-115.

* cited by examiner

METHOD AND APPARATUS FOR INSTALLATION AND REMOVAL OF OVERHEAD COOLING EQUIPMENT

RELATED APPLICATIONS

This application is a continuation of U.S. patent application Ser. No. 12/483,408, entitled METHOD AND APPARATUS FOR INSTALLATION AND REMOVAL OF OVERHEAD COOLING EQUIPMENT by Roy Grantham, et al., filed on Jun. 12, 2009. This application also relates to U.S. patent application Ser. No. 12/477,638, entitled HOT AISLE CONTAINMENT COOLING UNIT AND METHOD FOR COOLING, by John Bean et al., filed on Jun. 3, 2009, which is incorporated herein by reference in its entirety for all purposes.

BACKGROUND OF INVENTION

1. Field of Invention

The present disclosure relates to air cooling systems, and more particularly to apparatus and methods for mounting and removing overhead cooling unit assemblies in cooling enclosures of the type used to house data processing, networking, and telecommunications equipment.

2. Discussion of Related Art

Electronic equipment, such as computer servers, telecommunications equipment, uninterruptible power supplies, and similar equipment is often mounted in racks. A number of different standards have been developed to enable equipment manufacturers to design rack mountable equipment that can be mounted in standard racks manufactured by different manufacturers. One such standard is the Electronic Industries Alliance's EIA-310-D standard which defines parameters for what has become an industry standard nineteen inch equipment rack.

Nineteen inch equipment racks are used extensively in data centers and other facilities. With the proliferation of the Internet, it is not uncommon for a data center to contain hundreds of these equipment racks.

The electronic equipment mounted in electronic equipment racks produces heat. It is often desirable to remove heat generated by the electronic equipment in order to, for example, maintain the electronic equipment at a suitable operating temperature.

One solution that has been developed for the removal of heat generated by electronic equipment mounted in electronic equipment racks in a data center includes arranging multiple equipment racks in rows in such a manner that the equipment racks are in a side-to-side arrangement. A first row of equipment racks is positioned so that fronts of the equipment racks face outwardly from a center aisle. Similarly, a second row of equipment racks is positioned so that the fronts of the equipment racks face outwardly from the center aisle and backs of the equipment racks in the second row face backs of the equipment racks in the first row. The arrangement is such that cool air is drawn through the fronts of the equipment racks to cool the electronic equipment housed within the equipment racks. Hot air is exhausted through the backs of the equipment racks into the center aisle. The center aisle is sometimes referred to as the "hot" or "warm" aisle.

Warm air is directed from the equipment racks towards the hot aisle. The warm air rises, thus creating a situation in which the ceiling of the data center may become too warm. This situation may negatively affect the climate control and management within the data center. An air cooling system made up of multiple individual cooling units may be placed above the warm aisle in order to remove the warm air or to cool the air within the warm aisle.

Larger capacity cooling units are often ceiling mounted over the hot aisle. Lower capacity cooling units are often rack mounted, but not over the hot aisle. Ceiling mounting of the larger capacity units often involves individually hanging the units from a ceiling structure.

SUMMARY OF INVENTION

One aspect of the disclosure is directed to a data center. The data center may comprise a first row of equipment racks, a second row of equipment racks, a hot aisle defined by a space between the first row of equipment racks and the second row of equipment racks, a first cooling unit configured to be disposed above the first row of equipment racks and the second row of equipment racks in such a manner that the first cooling unit spans the hot aisle, and a track system including a first track associated with the first row of equipment racks, a second track associated with the second row of equipment racks, a first roller assembly provided on one side of the first cooling unit, the first roller assembly being configured to ride along the first track, and a second roller assembly provided on an opposite side of the first cooling unit, the second roller assembly being configured to ride along the second track.

According to an embodiment of the data center, each of the first and second roller assemblies includes a roller and each of the first and second tracks includes a channel, the arrangement being such that the roller of a roller assembly is configured to fit within the channel of the track. The track system may further includes a third track associated with the first cooling unit above the first roller assembly and a fourth track associated with the first cooling unit above the second roller assembly, the arrangement being such that the third and fourth tracks are configured to receive first and second roller assemblies of a second cooling unit. Each of the first and second roller assemblies may include a roller, and each of the first, second, third and fourth tracks may include a channel, the arrangement being such that the roller of a roller assembly is configured to fit within the channel of the track and roll along a length of the track. Each of the first and second roller assemblies may include a bracket configured to be secured to the first cooling unit and a roller rotatably secured to the bracket. The roller may be rotatably secured to the bracket at an angle with respect to a plane defined by the bracket. Each of the first and second tracks may include a V-shaped channel formed in the track, the arrangement such that the roller of a roller assembly is configured to fit within the channel of the track and roll along a length of the track.

Another aspect of the disclosure is directed to a track system for moving cooling units of a data center of the type comprising a first row of equipment racks, a second row of equipment racks, a hot aisle defined by a space between the first row of equipment racks and the second row of equipment racks, and a first cooling unit configured to be disposed above the first row of equipment racks and the second row of equipment racks in such a manner that the first cooling unit spans the hot aisle. The track system may comprise a first track associated with the first row of equipment racks, a second track associated with the second row of equipment racks, a first roller assembly provided on one side of the first cooling unit, the first roller assembly being configured to ride along the first track, and a second roller assembly provided on an opposite side of the first cooling unit, the second roller assembly being configured to ride along the second track.

According to an embodiment of the track system, each of the first and second roller assemblies includes a roller, and each of the first and second tracks includes a channel, the arrangement being such that the roller of a roller assembly is configured to fit within the channel of the track. The track system may further comprise a third track associated with the first cooling unit above the first roller assembly and a fourth track associated with the first cooling unit above the second roller assembly, wherein the arrangement is such that the third and fourth tracks are configured to receive first and second roller assemblies of a second cooling unit. Each of the first and second roller assemblies may include a roller, and each of the first, second, third and fourth tracks may include a channel, the arrangement being such that the roller of a roller assembly is configured to fit within the channel of the track and roll along a length of the track. Each of the first and second roller assemblies may include a bracket configured to be secured to the first cooling unit and a roller rotatably secured to the bracket. The roller may be rotatably secured to the bracket at an angle with respect to a plane defined by the bracket. Each of the first and second tracks may include a V-shaped channel formed in the track, the arrangement such that the roller of a roller assembly is configured to fit within the channel of the track and roll along a length of the track.

Another aspect of the disclosure is directed to a data center. The data center may comprise a first row of equipment racks, a second row of equipment racks, a hot aisle defined by a space between the first row of equipment racks and the second row of equipment racks, a first cooling unit configured to be disposed above the first row of equipment racks and the second row of equipment racks in such a manner that the first cooling unit spans the hot aisle, and means for slidably positioning the first cooling unit above the hot aisle.

According to an embodiment of the data center, the means for slidably positioning the first cooling unit above the hot aisle may comprise a first track associated with the first row of equipment racks, a second track associated with the second row of equipment racks, a first roller assembly provided on one side of the first cooling unit, the first roller assembly being configured to ride along the first track, and a second roller assembly provided on an opposite side of the first cooling unit, the second roller assembly being configured to ride along the second track. The data center may further comprise means for slidably positioning a second cooling unit on top of the first cooling unit. The means for slidably positioning a second cooling unit on top of the first cooling unit may comprise a third track associated with the first cooling unit above the first roller assembly, and a fourth track associated with the first cooling unit above the second roller assembly, wherein the arrangement is such that the third and fourth tracks are configured to receive first and second roller assemblies of a second cooling unit. Each of the first and second roller assemblies may include a roller, and each of the first, second, third and fourth tracks may include a channel, the arrangement being such that the roller of a roller assembly is configured to fit within the channel of the track and roll along a length of the track.

Another aspect of the disclosure is directed to a method for installing a cooling unit above a hot aisle of a data center including a plurality of equipment racks. The method may comprise raising a first cooling unit above the plurality of equipment racks, placing the first cooling unit on a track system, and positioning the first cooling unit in a desired location above the hot aisle. The method may further comprise raising a second cooling unit above the first cooling unit, placing the second cooling unit on the track system, and positioning the second cooling unit in a desired location above the hot aisle. The method may further comprise removing a second cooling unit from the hot aisle by raising the second cooling unit above the first cooling unit, placing the second cooling unit on the track system, and moving the second cooling unit to a position in which is removed from the hot aisle.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
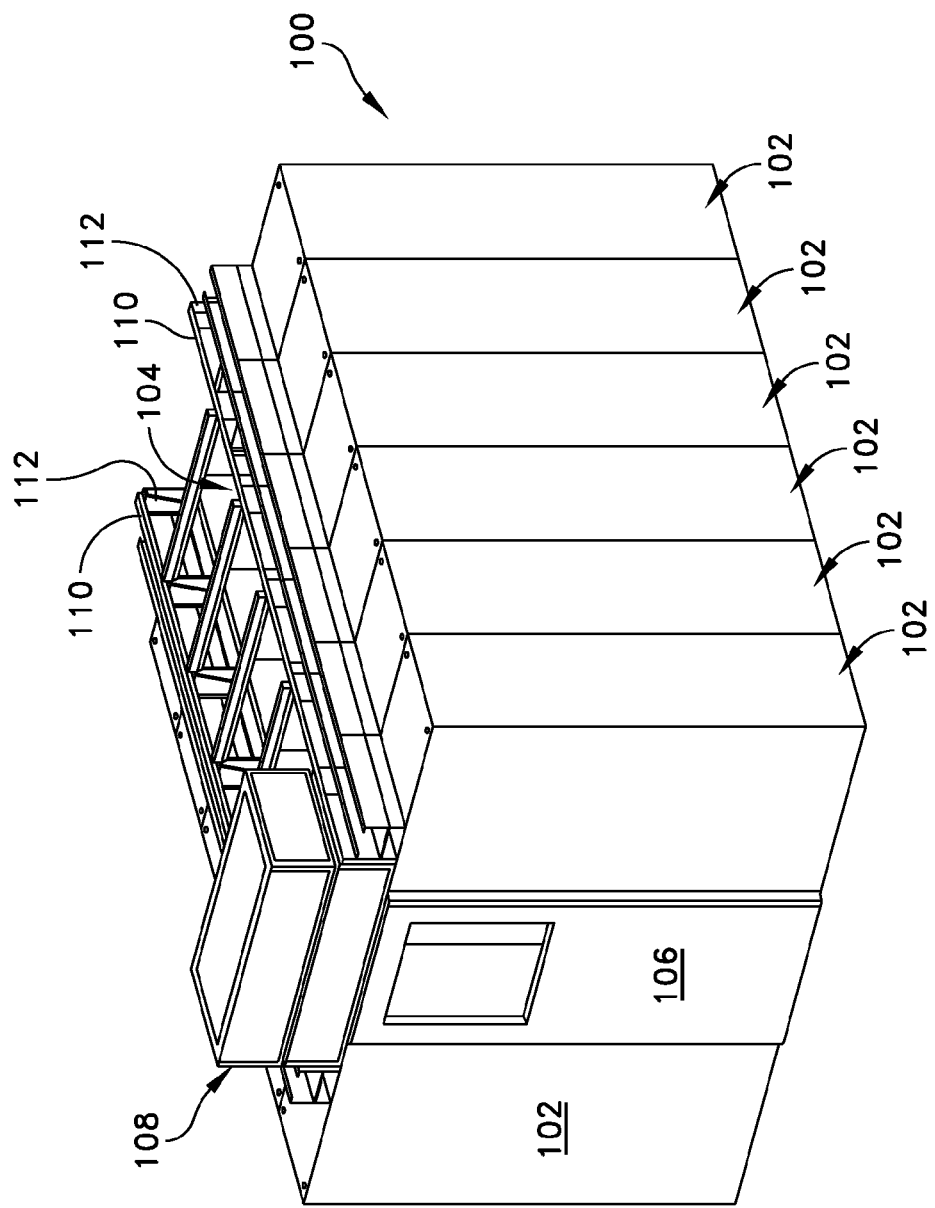
FIG. 1 is an isometric view of a section of a data center including a single cooling unit according to an embodiment of the present disclosure.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The disclosure is capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

A data center cooling unit according to one example of the present disclosure is designed to be positioned above a hot aisle of an electronics equipment rack cluster. The hot aisle may be as narrow as about 36" wide, and in some embodiments about 48" wide. A cooling unit according to embodiments of the present disclosure may weigh 100 pounds or more. As such, placing the cooling unit overhead so that the cooling unit spans the hot aisle at a location other than at the end of an aisle may be difficult. In addition, if the ceiling of the hot aisle were full of over-aisle cooling units, removing or moving one of the cooling units positioned in the middle of the cooling units may be difficult.

It may be difficult to ceiling install overhead equipment, such as cooling units, once electronic equipment racks are in place in a data center. If on-rack installation is desired, it may be difficult to install high capacity overhead cooling equipment onto the racks. It may be difficult to remove overhead equipment without disrupting the operational equipment, especially in an equipment rack cluster including a 36-inch hot aisle. It also may be difficult to move existing ceiling mounted overhead cooling equipment to accommodate data center changes within a row of electronic equipment racks.

Some embodiments of the present disclosure provide for a safe and efficient method of installation and removal of overhead (over-aisle) cooling units. Some embodiments of the present disclosure provide a method for removing cooling units from a location inside a row of cooling units, without taking any of the other cooling units out of operation. Some embodiments of the present disclosure provide a method of relocating or rearranging cooling units along a row of electronic equipment racks.

Utilizing a roller and track system in accordance with some embodiments of the present disclose for the installation and removal of overhead electronic equipment rack cooling units facilitates installation of the cooling units in a manner that is more safe and less difficult versus prior methods. A track system can be installed onto rack supports or onto a frame system mounted above a row of electronic equipment racks. Once the tracks are installed, the cooling units can be lifted up and placed onto the tracks, then rolled or slid into position.

In accordance with some embodiments, each cooling unit, or filler section (which may be used in lower density applications where it is not needed to fill the entire ceiling of a hot aisle with cooling units), includes a section of track on top, so that when installed in a row, they together form a continuous track. If a cooling unit or a filler section needs to be moved or removed from the row of equipment racks, it may be lifted up (after taking it out of service) and rolled on top of the other cooling units and/or filler sections in the row, to the end of row, where it can then be removed and lowered to the ground.

In some embodiments, offset twin roller assemblies are mounted proximate each of the four corners of the bottom of each cooling unit. A V-shaped track system for rolling the cooling units into position is provided to support the cooling units above the equipment racks. A plurality of V-shaped tracks is also included in the top of each of the cooling units and the filler sections (when present) disposed on the row of equipment racks.

In some embodiments, a V-shaped track is mounted to either a rack support or a ceiling mounted frame along the entire length of the row of equipment racks desired to be cooled. Each cooling unit is equipped with roller assemblies proximate each of the four corners of the bottom of the unit. Each of the roller assemblies contain two rollers, offset to form a composite V-shaped roller assembly, configured to fit into a recess in the V-shaped track. The top of each cooling unit is equipped with one or more track sections. The track sections on the top of the cooling units cover most or all of the width of the units. The track sections on the top of the cooling units are located such that they align with the roller assemblies on the bottom of the units. The track sections on the top of the cooling units facilitate removal of cooling units from the row of equipment racks as will be described in greater detail below.

In order to install the cooling units on a row of equipment racks, the cooling units are brought to the end of the row and lifted up in the air. The rollers located on the bottom of the cooling unit are aligned with the tracks mounted on top of the row of equipment racks. The rollers are placed into recesses in the tracks. The cooling unit is then rolled into the desired position in the row. The cooling unit may be locked in place at a desired position on the track system. Additional cooling units may be placed onto the track system in the same manner. Filler sections are positioned onto the track as desired in a similar manner.

If a cooling unit needs to be removed from in the row, it is disconnected from service and unlocked from its position on the track. It is then lifted up into the air and placed onto the track system on the top of a neighbor unit (or filler section). The cooling unit can then be rolled to the end of the row of equipment racks and then lowered from on top of the equipment racks. Alternatively, a cooling unit could be rolled to an empty location, where a filler section has been removed, to add cooling capacity to the row of cooling units.

There are numerous shapes and styles for the track and roller arrangement that could be made. For example, the tracks may be formed as round or semi-round shaft tracks, U-channel tracks, or T-tracks. Rollers assemblies could be provided to fit the type of track system utilized.

Referring to FIG. 1, there is illustrated a portion of a data center generally indicated at 100 according to an embodiment of the present disclosure. The portion of the data center 100 includes two rows of electronics cabinets, each indicated at 102. Although illustrated as having solid walls, in some embodiments, these electronics cabinets 102 would have one or more vent holes provided in their front and/or back and/or upper walls in order to allow the passage of air through the electronics cabinets 102. In other embodiments, the walls of the cabinets may be fabricated from perforated panels to allow air to freely enter the cabinets. In some alternate embodiments one or more of the electronics cabinets 102 may be substituted by a dummy unit or a cooling unit, which may be of substantially the same shape and size as the electronics cabinets 102. The two rows of electronics cabinets 102 define a hot aisle 104 therebetween. In some embodiments, the hot aisle is closed on one or more ends by a structure such as a door 106. Also illustrated in FIG. 1 is a cooling unit 108 mounted above a portion of the hot aisle 104. The cooling unit 108 is mounted on a pair of tracks, each indicated at 110. The tracks 110 are mounted on a number of on-rack supports 112. In alternate embodiments, more or fewer of tracks 110 may be utilized to support the cooling unit 108. The tracks 110 may be positioned differently than the configuration illustrated in the drawing figures. Additionally, the shapes and sizes of elements, such as the cooling unit 108, the electronics cabinets 102, the door 106, the on-rack supports 112, etc. are not meant to be limiting and in different embodiments may vary from what is illustrated.

Figure 2:
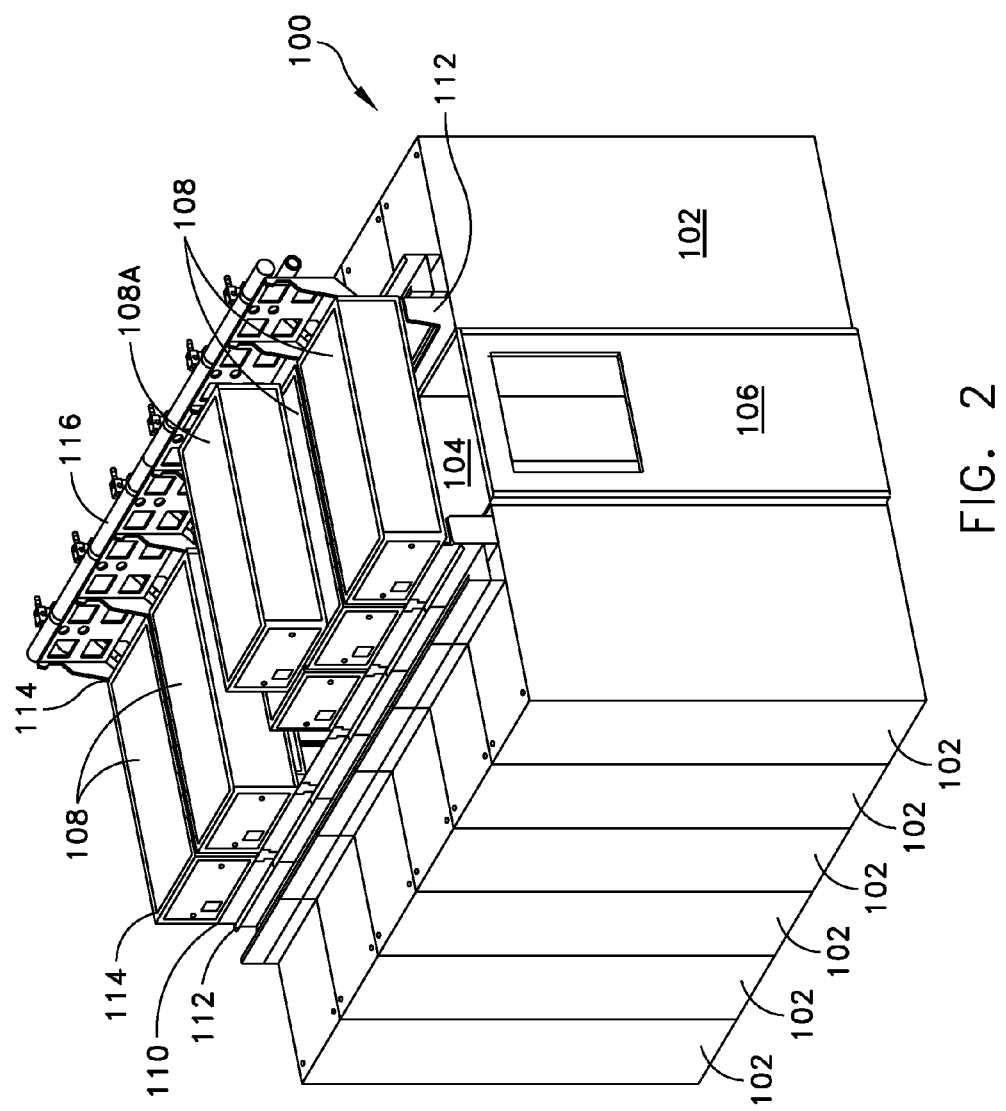
FIG. 2 is an isometric view of a section of the data center of FIG. 1 including multiple cooling units.

FIG. 2 illustrates the portion of the data center 100 of FIG. 1 with multiple cooling units 108 mounted on the tracks 110. Additionally, one of the cooling units 108A is illustrated resting on top of another cooling unit or cooling units 108. The cooling units 108 are equipped with tracks 114 on their upper sides, which may support other cooling units 108. The tracks 114 may be spaced apart from one another by the same distance as the tracks 110. In use, providing for tracks on top of the cooling units 108 along which other cooling units 108 may travel allows for a cooling unit 108 from within a group of cooling units 108 to be removed from the data center 100 without removing other cooling units 108 that may be closer to an end of the hot aisle 104 than the cooling unit being removed. This track system also allows for the positions of the cooling units 108 to easily be swapped, should the need arise. Also illustrated in FIG. 2 is a facilities supply rack 116, which may be used to support conduits for water, power, air, or other utilities that may be connected to the cooling units 108 or to equipment within the equipment racks 102. Lifting mechanisms, such as ratchet assemblies, may, in some embodiments, be mounted on top the row of equipment racks to facilitate lifting and lowering of the cooling units.

Figure 3:
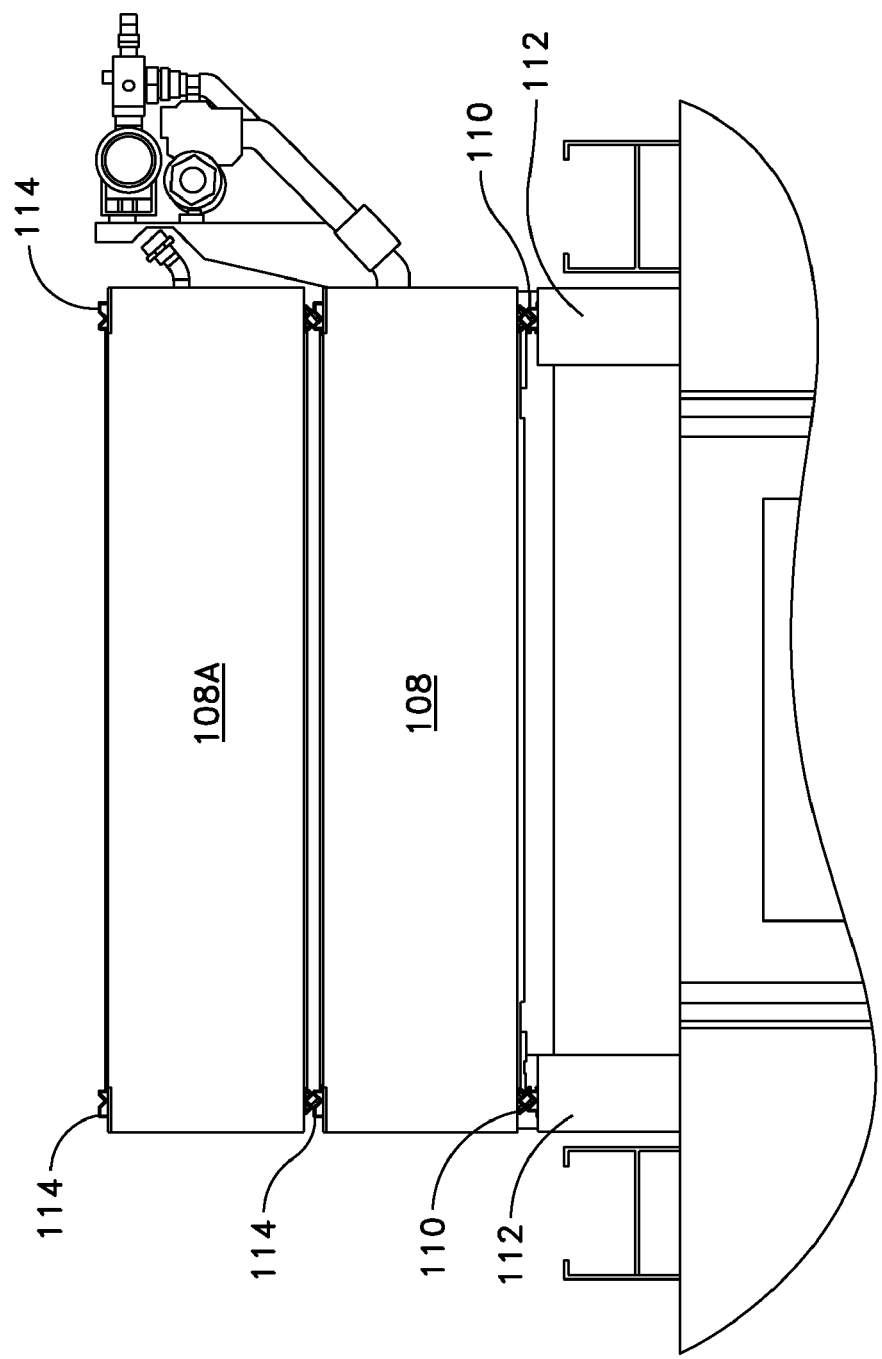
FIG. 3 is a side view of the upper portion of the section of the data center shown in FIG. 2 illustrating a first cooling unit positioned on top of a second cooling unit.

FIG. 3 is a side view of a pair of cooling units 108, 108A on top a portion of a data center such as the data center illustrated in FIG. 2. A roller assembly of the cooling unit 108 rests in tracks 110, while the cooling unit 108A on top of the cooling unit 108 includes a roller assembly that rests in tracks 114 disposed on top of the cooling unit 108. The roller assemblies may, in some embodiments, include one or more casters or rollers. The cooling unit 108A also includes tracks 114 on its upper surface.

Figure 4:
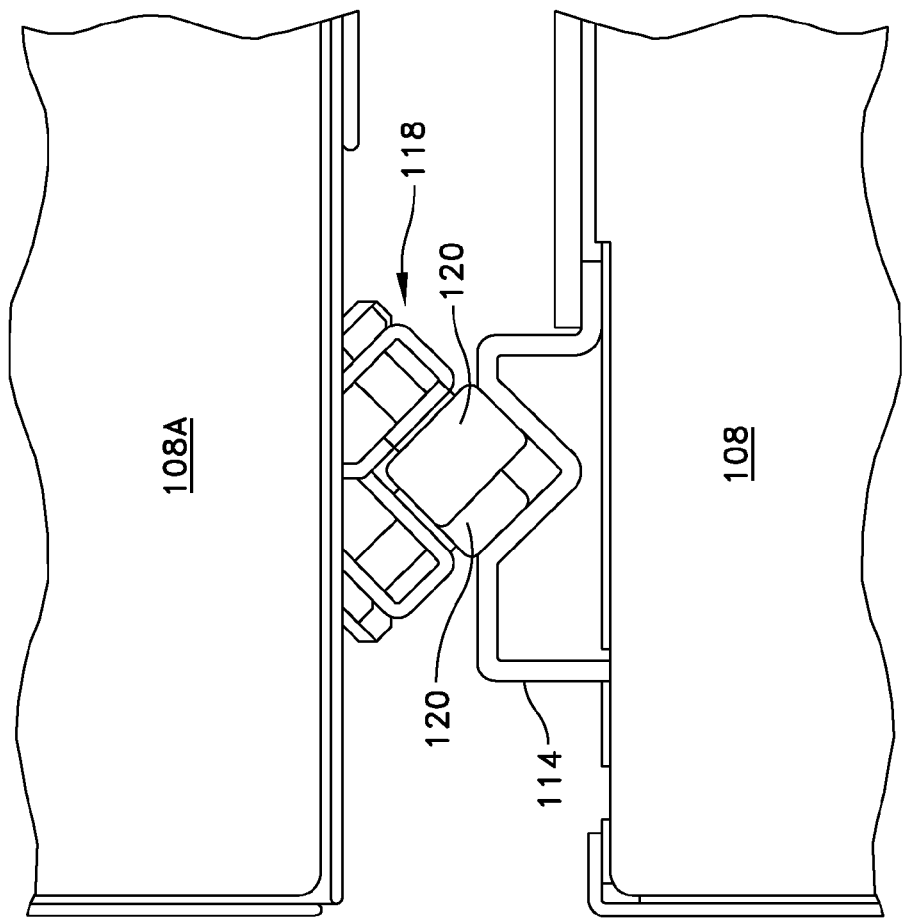
FIG. 4 is an enlarged view of a roller assembly of the first cooling unit shown in FIG. 3 disposed in a track assembly of the second cooling.

FIG. 4 is a close up view of the interface between the cooling unit 108 and the cooling unit 108A shown in FIGS. 2 and 3. As can be seen, the cooling unit 108A has a roller assembly 118 mounted to its bottom surface. The roller assembly 118 includes a pair of rollers, each indicated at 120. These rollers 120 are positioned and angled so as to fit into a V-shaped channel in the track 114 secured on top of the cooling unit 108. In some embodiments, the tracks 114 are positioned proximate to sides of the cooling units. In some embodiments, each of the tracks 114 runs along a side of the cooling unit 108 at the edge of the cooling unit 108. In other embodiments, one or both of the tracks 114 are spaced from the edge of the cooling unit 108. In some embodiments, the tracks 114 run parallel to edges of the cooling unit 108. The cooling units 108, in one embodiment, include four roller assemblies 118 mounted to their bottom surfaces. Each roller assembly is positioned proximate to a corner of the bottom side of each cooling unit. In other embodiments, more or fewer than four roller assemblies 118 may be present. For example if three tracks 114 are used on top of the cooling units 108, then either five or six or more of roller units 118 may be utilized.

Figure 5:
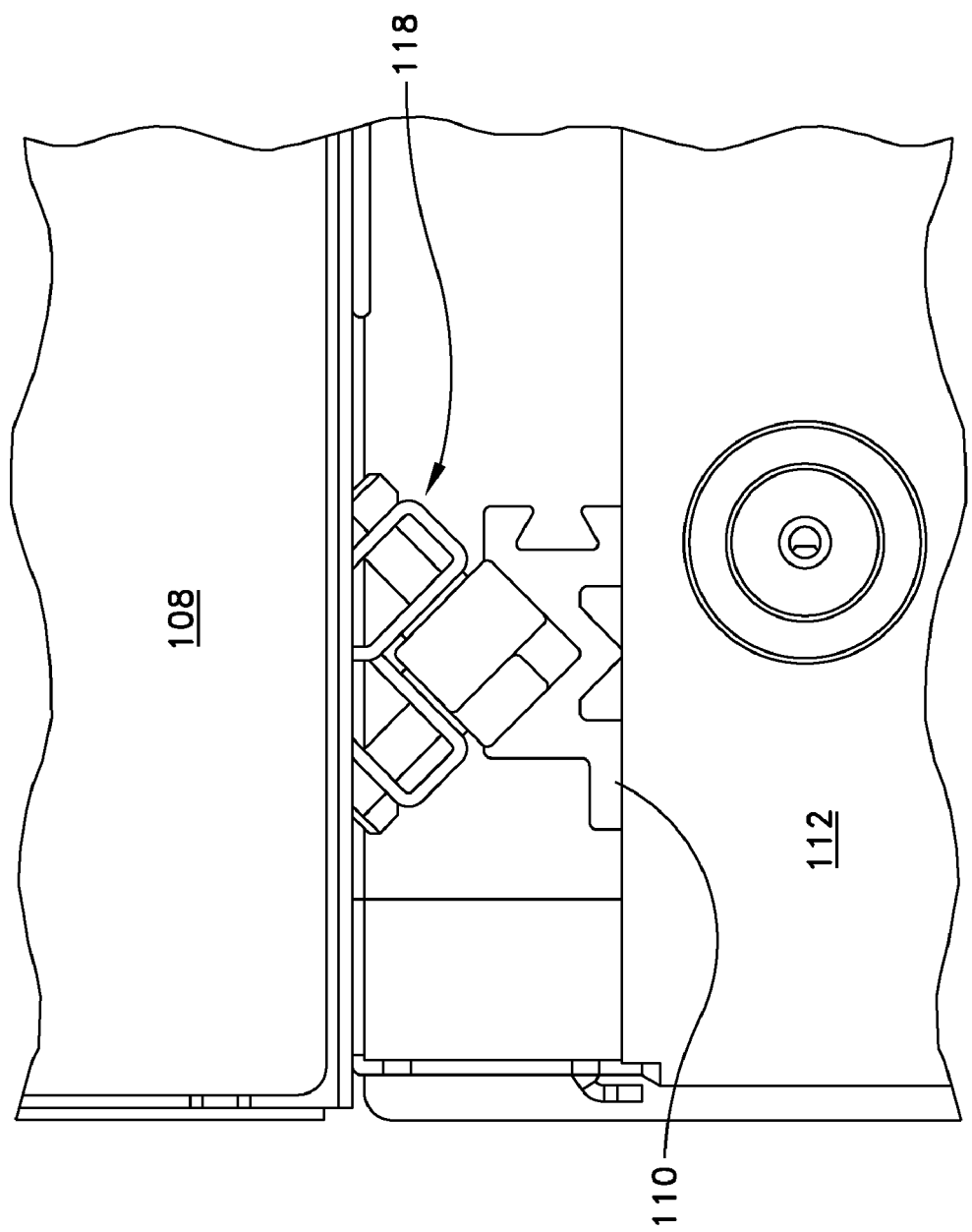
FIG. 5 is an enlarged view of a roller assembly of the second cooling unit of FIG. 3 disposed in a track assembly of FIG. 3.

FIG. 5 is a close up view of an embodiment of the interface between a cooling unit 108 and a section of the track 110. The track 110 may include a V-shaped channel similar in shape and size to the channel provided in the track 114. The track 110 may be secured on top of a plurality of on-rack supports 112, which are themselves mechanically secured on top of the equipment racks. The track 110 may, in some embodiments, be formed of a heavier or thicker stock of material than the track 114. This would allow the track 110 to support more weight, for example two cooling units, than the track 114. In some embodiments, the tracks 110 and 114 are substantially identical.

Figure 6:
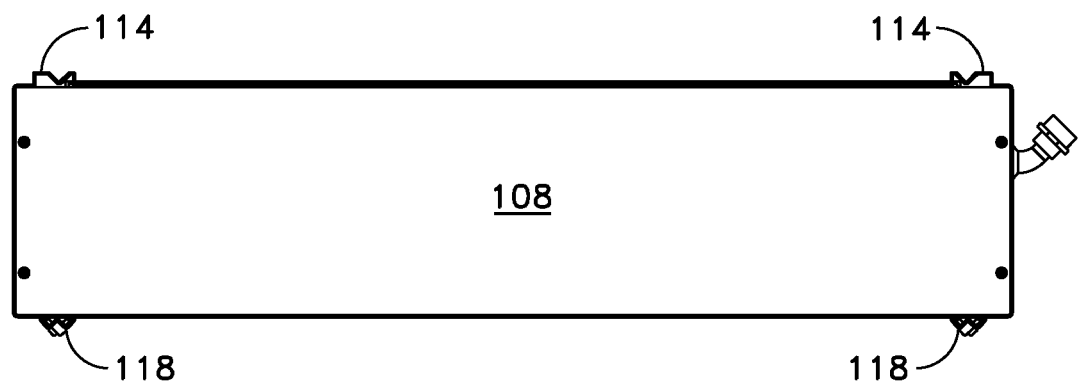
FIG. 6 is a view of a cooling unit from one side according to an embodiment of the present disclosure.
Figure 7:
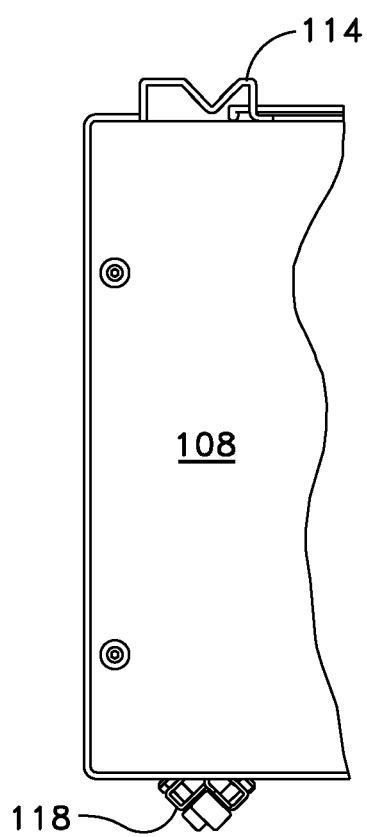
FIG. 7 is an enlarged view of an end portion of the cooling unit shown in FIG. 6.

FIGS. 6 and 7 illustrate side views of a single cooling unit 108, with FIG. 7 being a close up view of one side of the cooling unit 108. As can be seen, the cooling unit 108 includes a pair of tracks 114 secured to an upper side of the cooling unit along opposite sides of the cooling unit. The cooling unit 108 further includes multiple roller assemblies 118 secured to a lower side of the cooling unit below the location of the tracks 114. The tracks 114 and roller assemblies 118 are vertically aligned with one another. In alternate embodiments, the tracks 114 and roller assemblies 118 may be positioned in alternate positions from those illustrated. For example, in one embodiment, the tracks may be positioned perpendicularly to the positions illustrated in the figures. In some embodiments, additional tracks and/or roller assemblies may be present. For example, in one embodiment, a third track may be positioned proximate the center of the upper portion of the cooling unit 108 and one or more roller assemblies may be positioned on the lower surface of the cooling unit, so that the roller assemblies ride in the third track. The tracks 114 and/or roller assemblies 118 may be secured to the cooling unit using any of a variety of fastening methods. For example, the tracks 114 and/or roller assemblies 118 may be secured to the cooling unit using screws, rivets, bolts or other fasteners, or may be attached to the cooling unit 108 by welding or by an adhesive, such as epoxy. In some embodiments, the tracks 114 and/or roller assemblies 118 are releasably secured to the cooling unit 108.

Figure 8:
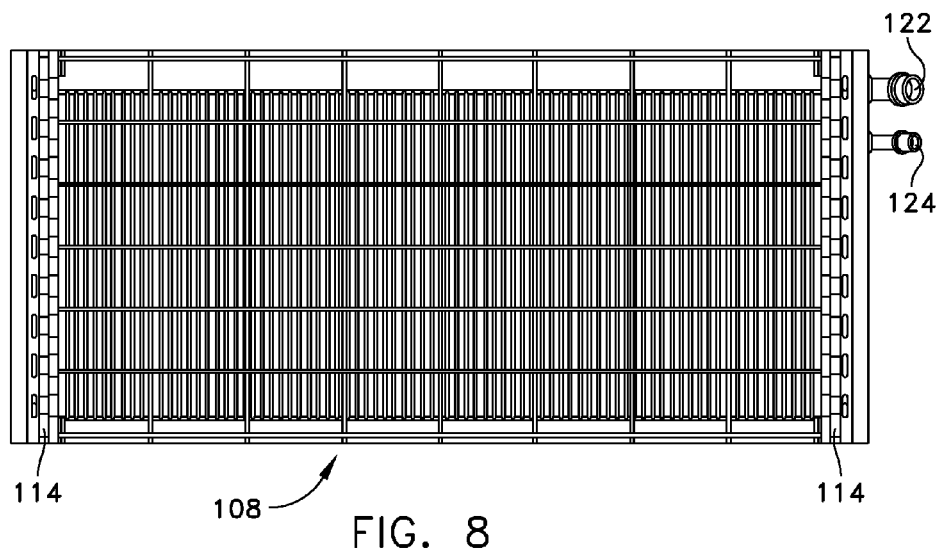
FIG. 8 is a top plan view of a cooling unit according to an embodiment of the present disclosure.
Figure 9:
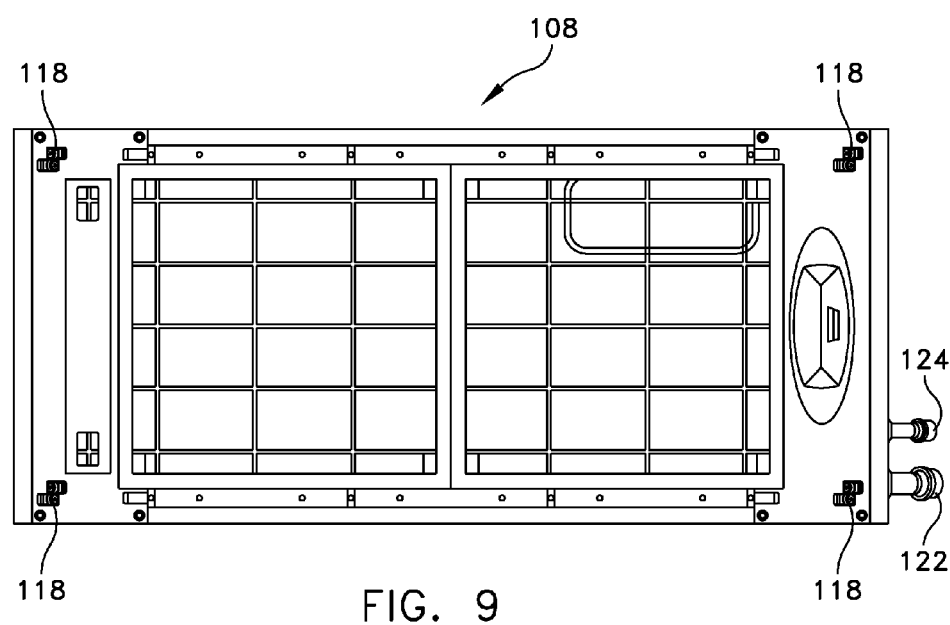
FIG. 9 is a bottom plan view of a cooling unit according to an embodiment of the present disclosure.
Figure 10:
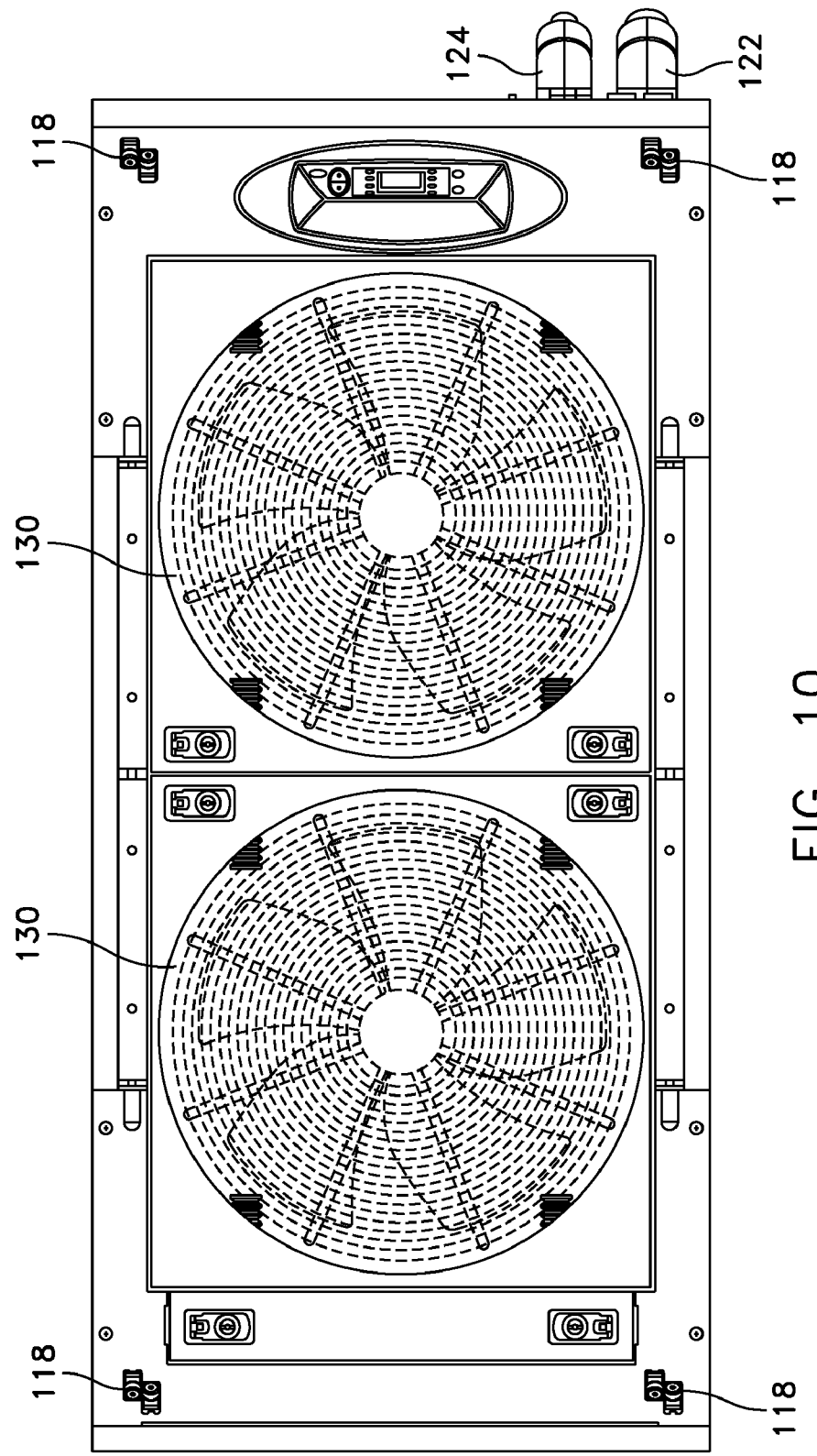
FIG. 10 is a bottom plan view of a cooling unit according to another embodiment of the present disclosure.
Figure 11:
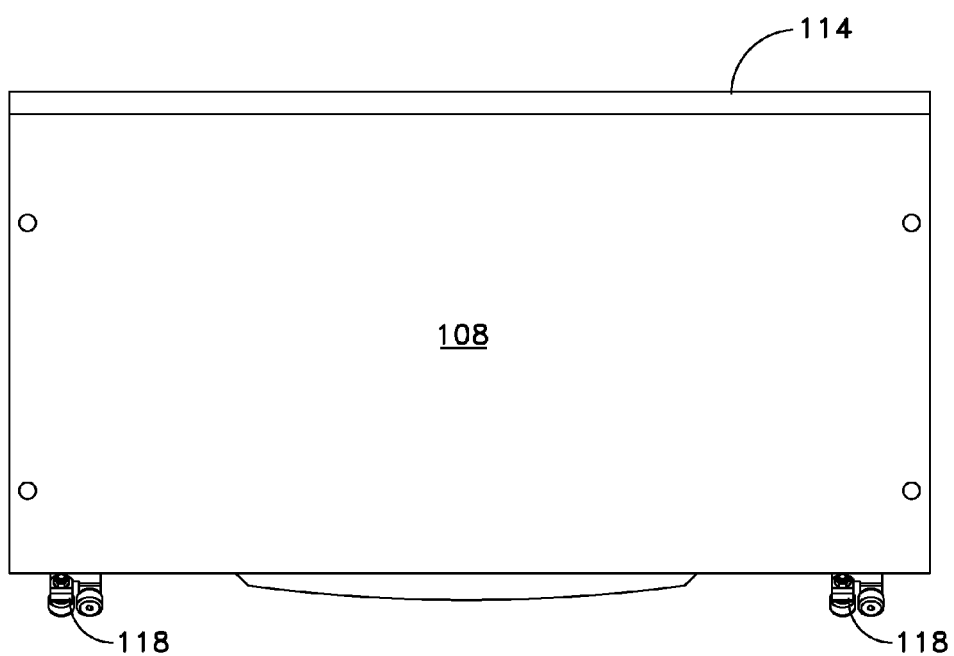
FIG. 11 is a view of a cooling unit from the front according to an embodiment of the present disclosure.

FIGS. 8 and 9 are views of the top and the bottom surfaces of a cooling unit 108, respectively. In the illustrated embodiment, the roller assemblies are located proximate a front and a rear edge of the cooling unit 108. In alternate embodiments, one or more roller assemblies 118 may be located with a different spacing from the front and/or rear and/or side edges of the cooling unit 108. In some embodiments, one or more additional roller assemblies 118 may be present at any of various locations on the bottom of the cooling unit 108. In an alternate embodiment, both the tracks 114 and the roller assemblies 118 are positioned outside the area defined by the top and bottom surfaces of the cooling unit 108 and may be secured to the cooling unit by, for example, mounting brackets or supports. The cooling unit may include fluid inlets and outlets 122 and 124, which may be utilized to introduce cool or cold water or gas into the cooling unit during operation. FIG. 10 is a view of the bottom surface of an alternative embodiment of a cooling unit 108 including a pair of substantially circular air passageways 130. In alternate embodiments, more or fewer air passageways may be present in a cooling unit 108. FIG. 11 is a view of a side surface of the cooling units of FIGS. 8-10.

Figure 12D:
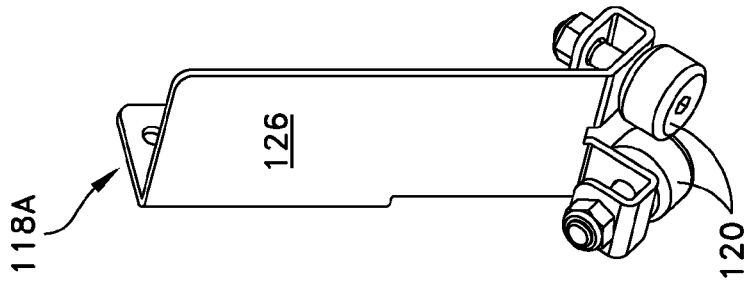
FIG. 12D is an isometric view of an alternate roller assembly according to an embodiment of the present disclosure.
Figure 12C:
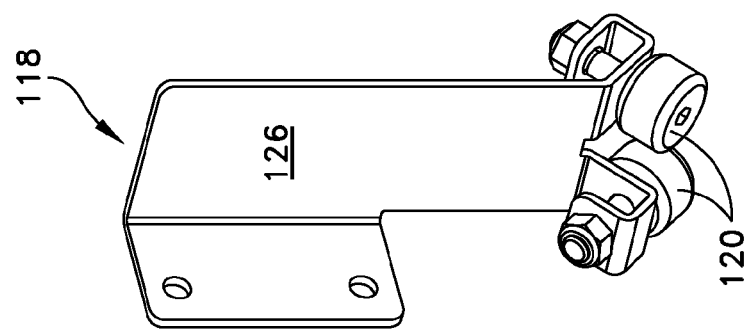
FIG. 12C is an isometric view of the roller assembly shown in FIG. 12A.
Figure 12B:
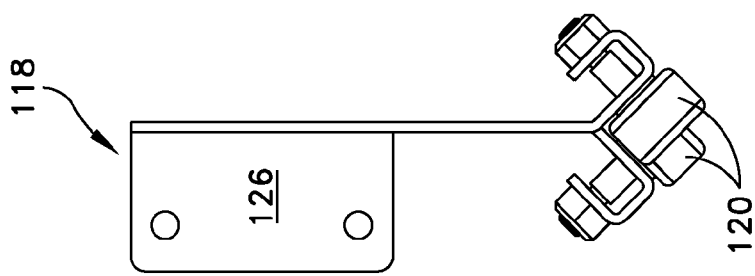
FIG. 12B is a front view of the roller assembly shown in FIG. 12A.
Figure 12A:
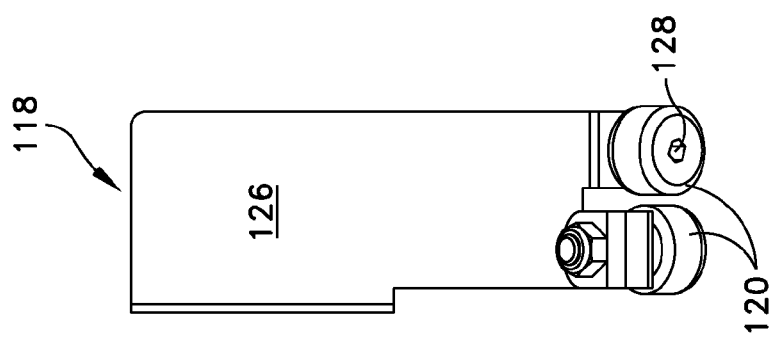
FIG. 12A is a side view of a roller assembly according to an embodiment of the present disclosure.
Figure 13B:
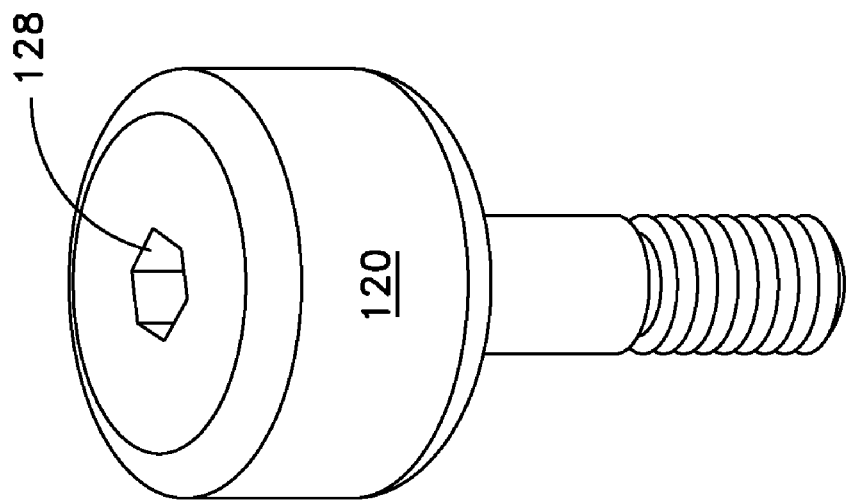
FIG. 13B is another isometric view of the roller shown in FIG. 13A.
Figure 13A:
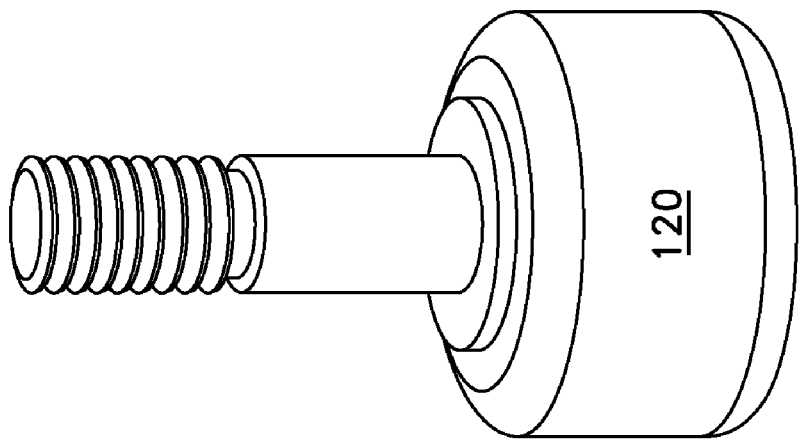
FIG. 13A is an isometric view of a roller according to an embodiment of the present disclosure.

FIGS. 12A-12D illustrate embodiments of roller assemblies 118, 118A according to embodiments of the present disclosure. The roller assembly 118 includes a pair of rollers 120. The rollers 120 are mounted on a bracket 126 at perpendicular angles to one another. The rollers 120 may include a threaded end portion, as is illustrated in FIGS. 13A and 13B, and may be secured to the bracket 126 by a nut in the manner illustrated in FIGS. 12A-12D. Other fastening mechanisms may be utilized in other embodiments. As show in FIG. 13B, the roller 120 may include a hexagonal recess 128 on a face thereof to facilitate mounting of the roller 120 on the bracket 126 by using an Allen wrench or a hex key. The recess 128 may also take the form of a slot or a cross such that a screwdriver may be used to facilitate mounting of the roller 120 on the bracket 126. In some embodiments, recess 128 may not be present. In alternate embodiments, more or fewer rollers 120 may be present on the roller assemblies 118. Also, the rollers 120 may be of different shapes in different embodiments. For example, the rollers may have sides that are more rounded than illustrated such that they approximate the shape of a ball, or may be in the form of slotted wheels. In some embodiments the rollers 120 may be replaced by a low friction material that may be used to slide a cooling unit 108 along a track 110, 114.

The bracket 126 of a roller assembly 118 may be formed of a single piece of material such as, but not limited to, aluminum or steel, and may be bent into the shape illustrated. In other embodiments, the bracket 126 may be formed of multiple pieces joined together by fasteners, such as screws or bolts, by welding, by an adhesive, or by other methods that would be appreciated by one of ordinary skill in the art. The bracket 126 may include one or more roller mounting surfaces having openings in which the rollers 120 may be mounted, as well as a mounting flange having openings or slots for attachment of the bracket 126 to a cooling unit 108. The bracket 126 may be left-handed as illustrated in FIGS. 12A-12C, or right-handed, as illustrated in FIG. 12D. The shape of the bracket illustrated is only one possible example, and is not intended to be limiting. In some embodiments, the bracket 126 is not utilized at all; rather the rollers 120 may be mounted directly onto a cooling unit 108.

Figure 14:
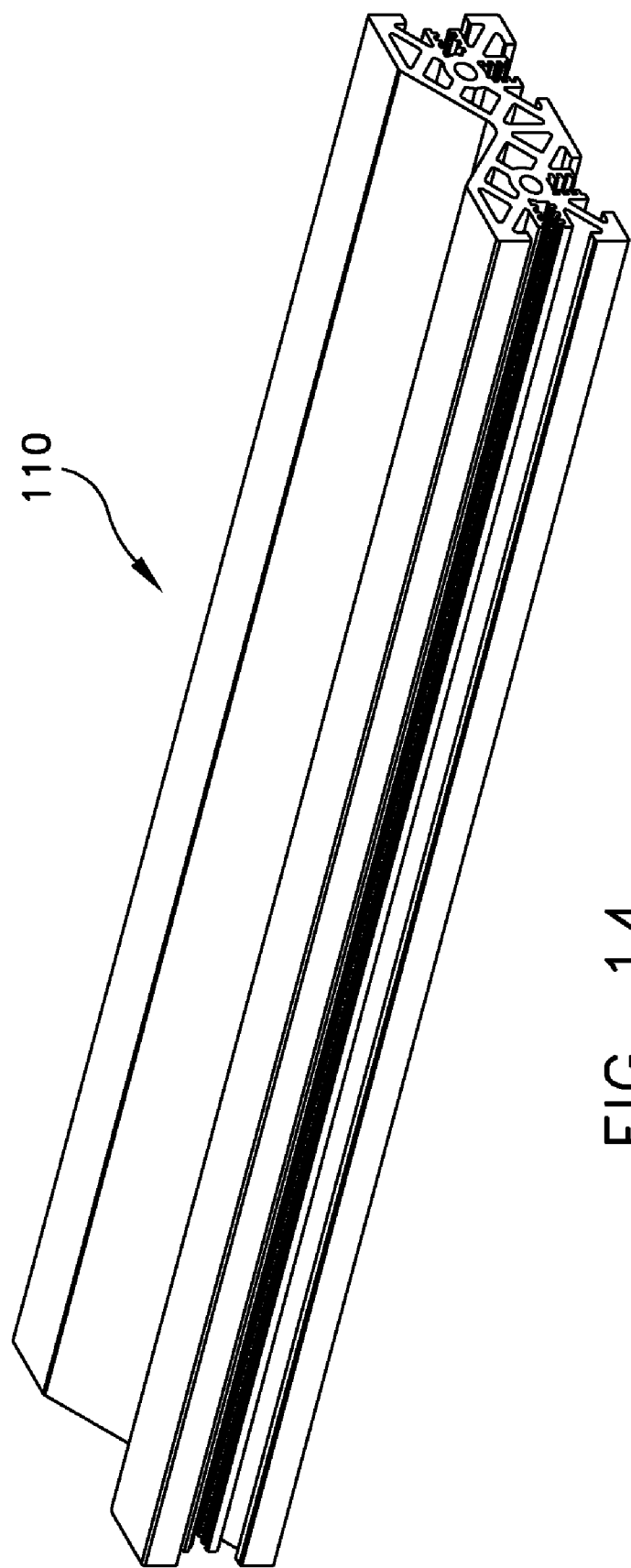
FIG. 14 is an isometric view of a portion of a track assembly according to an embodiment of the present disclosure.

FIG. 14 is an isometric view of a section of the track 110 illustrated in FIGS. 1-3 and 5. Sections of the track 110 may be formed by extrusion of a material such as, but not limited to, aluminum, steel, or plastic. The section of the track 110 may be formed of a single piece of material or by multiple pieces joined together by fasteners, such as screws or bolts, by welding, by an adhesive, or by other methods that would be appreciated by one of ordinary skill in the art. The track 110 may include slots and/or recesses and/or openings to facilitate attachment to, for example, a cooling unit 108 or to on-rack supports 112 or to a frame assembly. The section of track 110 may also include openings, slots and grooves, or other suitable fastening mechanisms that would facilitate the attachment of one section of track 110 to another section of track 110.

Figure 15A:
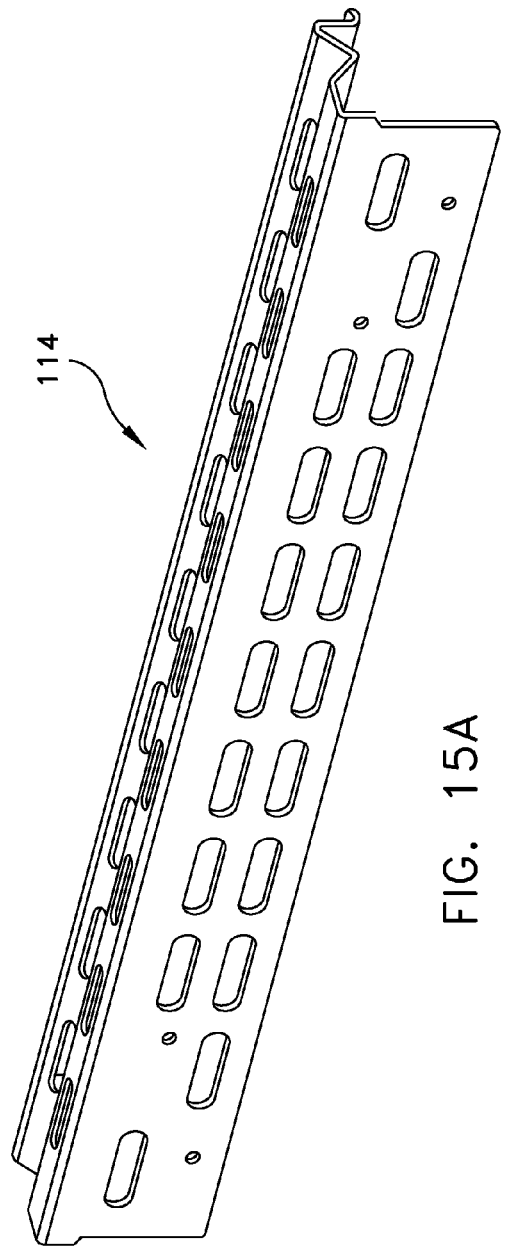
FIG. 15A is an isometric view of a portion of another track assembly according to an embodiment of the present disclosure.
Figure 15B:
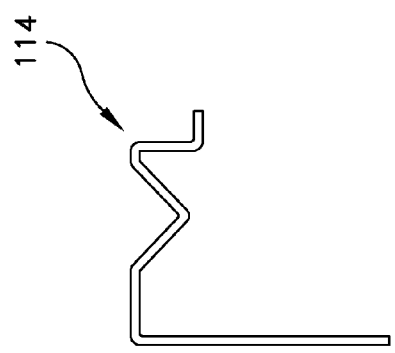
FIG. 15B is a front view of the portion of track assembly shown in FIG. 15A.

FIG. 15A is an isometric view and FIG. 15B is a front view of a section of the track 114 illustrated in FIGS. 2-4. Sections of the track 114 may be formed by extrusion of a material such as, but not limited to, aluminum, steel, or plastic, or by cutting and bending of a sheet of such a material. The section of the track 114 may be formed of a single piece of material or by multiple pieces joined together by fasteners, such as screws or bolts, by welding, by an adhesive, or by other methods that would be appreciated by one of ordinary skill in the art. The section of track 114 may include slots and/or recesses and/or holes to facilitate attachment to a cooling unit 108 or to on-rack supports 112 or to a frame assembly. The section of track 114 may also include holes, slots and grooves, or other suitable fastening mechanisms that would facilitate the attachment of one section of track 114 to another section of track 114.

Figure 16:
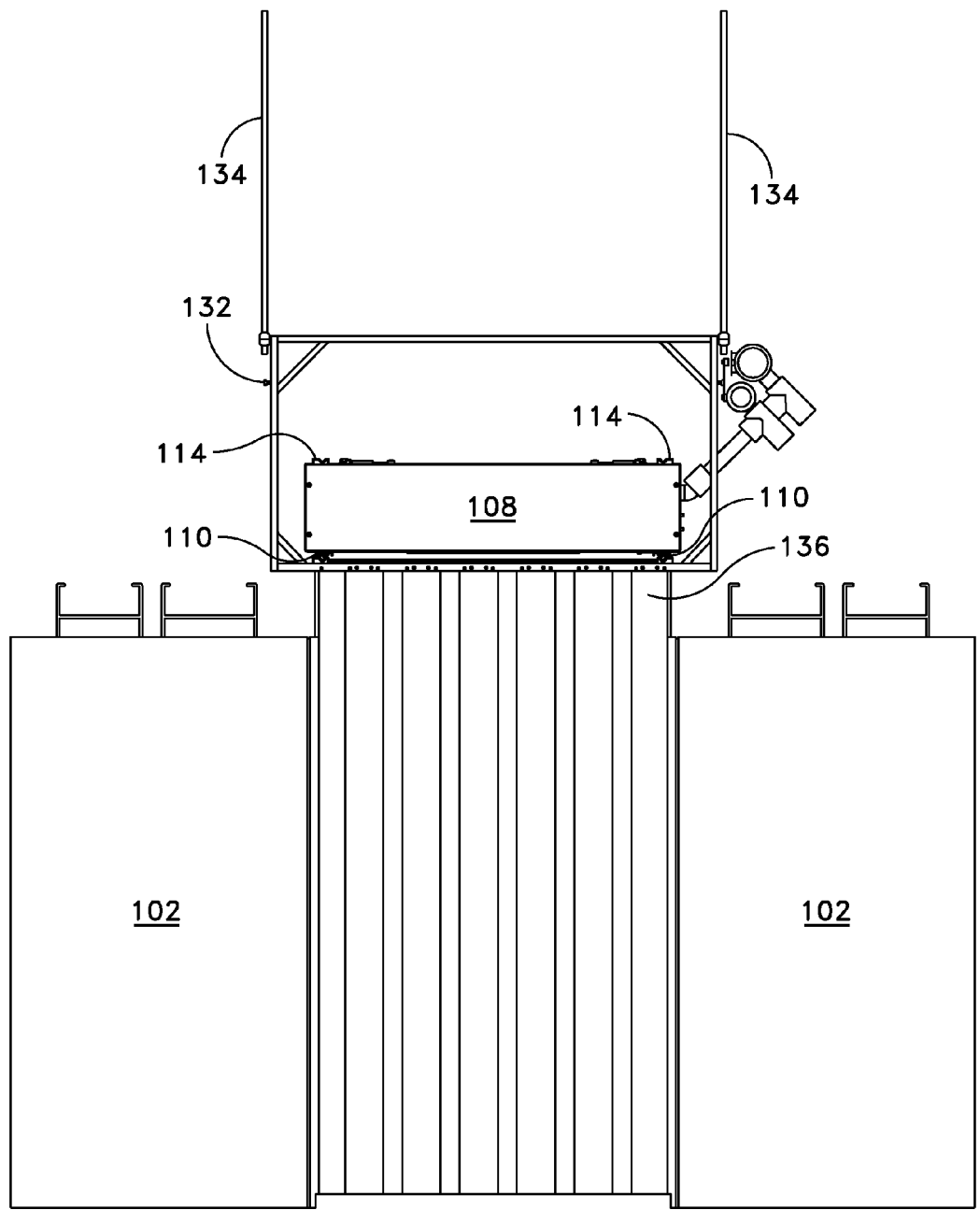
FIG. 16 is a side view of a section of a data center according to another embodiment of the present disclosure.
Figure 17:
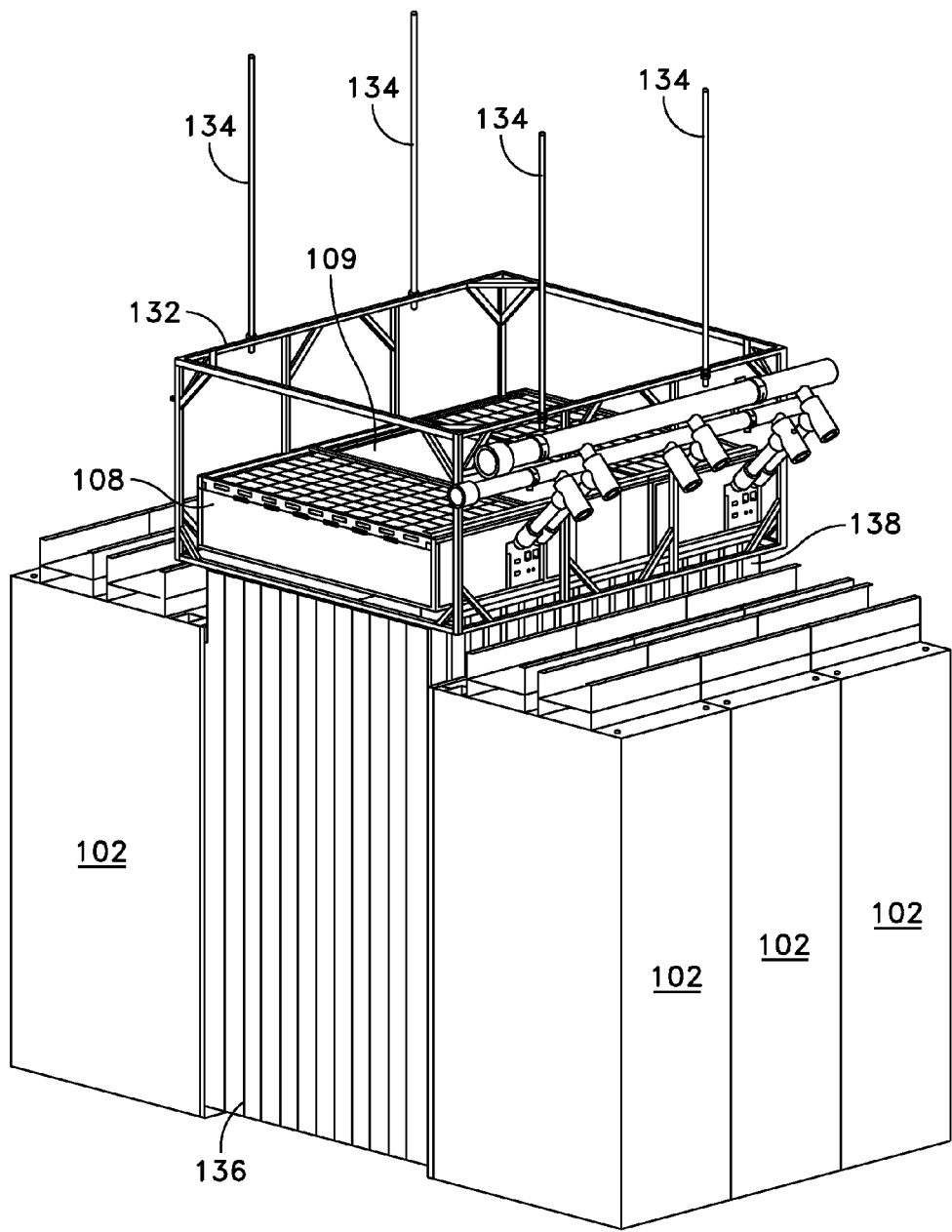
FIG. 17 is an isometric view of the data center of FIG. 16.

Illustrated in FIGS. 16 and 17 is an embodiment of a cooling assembly which is ceiling mounted above a portion of a data center including a plurality of equipment racks 102 or dummy racks. The embodiment illustrated in FIGS. 16 and 17 includes a frame assembly 132 hanging from a ceiling structure above. The frame assembly 132 is attached to the ceiling using threaded rods 134 and hardware, such as nuts and/or washers and/or cotter pins. The frame assembly 132 may be constructed of materials, such as aluminum, steel, plastic, or other suitable materials, and may be formed of multiple sections joined together by fasteners, adhesive, or by welding. The threaded rods 134 may in some embodiments be replaced by cables. A track system, including tracks 110, is attached to the frame assembly 132 and used in a similar manner as the "on-rack" track system illustrated in FIGS. 1-5, which is discussed above. Cooling units 108 or filler sections 109 may be mounted upon the track system in a similar manner as discussed above with reference to FIGS. 1-5. A piping system, which may deliver chilled coolant to the cooling units 108 and may exhaust heated coolant from the cooling units, may be supported from a rail that is attached to the side of the frame assembly 132. The frame assembly 132 is dimensioned so that the height of the frame will accommodate one cooling unit 108 being on top of another, to facilitate the installation and/or removal of cooling units from within the row, in a similar manner as discussed above with regard to an "on-rack" track system such as the system illustrated in FIGS. 1-5.

The embodiment of FIGS. 16 and 17 allows the cooling system to be independent from the racks 102 below, so that the racks below could be of different sizes and can be removed and/or replaced at any time without disturbing the cooling unit support system.

Also illustrated in FIGS. 16 and 17 is a hot aisle containment feature made from using curtains 136, 138 hanging from the frame assembly structure 132 to block off the end and sides (between the top of the racks 102 and the bottom of the frame 132) of the hot aisle. These curtains 136, 138 could be used in the place of the door 106 shown in FIG. 2 of the drawings. The curtains 136, 138 may be made from a material such as, for example, vinyl or another suitable material or materials.

A method of constructing the portion of data center 100 may include a first act of positioning a plurality of equipment racks 102 into a plurality of rows. The backs equipment racks in one row may be positioned to face the backs of the equipment racks of a second row to define a hot aisle 104 between the two rows. The equipment racks 102 may be secured to one another or to a floor by screws, bolts, or other securing methods to hold them in place relative to one another. In another embodiment, the equipment racks may be positioned or docked within a docking station configured to arrange equipment racks within the data center. A door 106 may be mounted at one or both ends of the hot aisle 104. One or more on-rack supports 112 may be mechanically secured on top of the equipment racks. One or more tracks 110 may be mechanically secured to the on-rack supports 112 or directly to the top of the equipment racks 102. A cooling unit 108 may be mounted above the hot aisle 104 by lifting the cooling unit and aligning one or more rollers 120 of one or more roller assemblies 118 mechanically coupled to the cooling unit with grooves or recesses in the track or tracks 110. A lifting mechanism, such as a pulley and cable system, may be utilized to lift the cooling unit 108. The rollers 120 may be placed into the recesses of the track or tracks 110. The cooling unit 108 may be rolled or slid along the tracks 110 into a desired position. The cooling unit 108 may then be locked into place in the desired position by a locking lever, a clamp, or by screws, bolts or other retaining mechanisms. Facility connections, such as power, air, and/or water, may then be attached to the cooling unit 108 and the cooling unit 108 may be brought on line. Additional cooling units 108 or filler sections may be mounted above the hot aisle 104 in a similar manner as desired.

A cooling unit 108 may be removed from an end portion of track 110 above a hot aisle 104 of a portion of a data center 100 by bringing the cooling unit offline, disconnecting any facility connections supplied to the cooling unit, unlocking or removing any locking mechanism that may be present to hold the cooling unit in place, lifting the cooling unit 108 from the track 110, and lowering the cooling unit from on top of the equipment racks 102. In certain circumstances, it may be desirable to remove a cooling unit from the track, but the cooling unit is blocked by other cooling units or filler sections. When this occurs, the cooling unit that is desired to be removed may be lifted up above an adjacent cooling unit, one or more rollers 120 of one or more roller assemblies 118 mechanically coupled to the cooling unit may be aligned with and placed into the grooves or recesses in the track or tracks 114 on top of the adjacent cooling unit, and the cooling unit to be removed may be rolled or slid along the track or tracks 114 on top of the one or more other cooling units until it is in a position from which it may be lifted and removed from the data center 100. This method may be performed without taking the one or more other cooling units offline, thus maintaining the operation of the rows of equipment racks disposed adjacent the hot aisle.

If a cooling unit 108 is desired to be placed into an empty spot within a row of other cooling units, the cooling unit may be lifted up above a first cooling unit in the row of cooling units, one or more rollers 120 of one or more roller assemblies 118 mechanically coupled to the cooling unit may be aligned with and placed into the grooves or recesses in the track or tracks 114 on top of a first cooling unit, and the cooling unit to be rolled or slid along the track or tracks 114 on top of the row of cooling units until it is in a position from which it may be lowered into the desired empty spot. The cooling unit may then be lowered into place, optionally locked into place, and connected to any facilities required to operate the cooling unit. The cooling unit may then be brought online. This method may be performed while the cooling units previously present are in operation.

Parts that could be used to construct a data center 100 or a track assembly on top of a portion of a data center may be supplied as a kit. The kit may include one or more sections of tracks 110 and or 114. The kit may also include one or more roller assemblies 118 which may include one or more rollers 120 and one or more brackets 118. The kit may further include one or more on-rack supports 112. In some embodiments, the kit may include one or more cooling units 108 configured such that one or more roller assemblies 118 and/or tracks 114 may be attached thereto. The kit may further include fasteners for connecting the various items in the kit. The kit may in some embodiments include a rack assembly, such as rack assembly 132 or materials that may be used to construct such a rack assembly. The kit may also include threaded rods 134 or cables and fasteners for attaching the rack assembly 132 to a ceiling. The kit may also include curtains 136, 138 that may be used to at least partially enclose a hot aisle 104 of a data center. The kit may also include instructions for assembling the data center 100 or track assembly, either in written form or provided on a computer readable medium, such as a compact disk.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A track system for maneuvering at least one cooling unit over a plurality of equipment racks arranged in a first row and in a second row within a data center, a space between the first row and the second row forming a hot aisle, the track system comprising:
   a first set of tracks disposed on the first row of equipment racks and the second row of equipment racks;
   a second set of tracks disposed on the at least one cooling unit; and
   at least one set of roller assemblies disposed on the at least one cooling unit, the at least one set of roller assemblies being configured to be received and roll within at least one of the first set of tracks and the second set of tracks.

2. The track system of claim 1, wherein the at least one cooling unit includes a first cooling unit having a first set of roller assemblies and a second cooling unit having a second set of roller assemblies, the first cooling unit is configured to roll on the first set of tracks, and the second cooling unit is configured to roll on the second set of tracks.

3. The track system of claim 2, wherein the first set of roller assemblies disposed on the first cooling unit are configured to roll along the first set of tracks and the second set of roller assemblies disposed on the second cooling unit are configured to roll along the second set of tracks.

4. The track system of claim 2, wherein the first set of roller assemblies disposed on the first cooling unit is vertically aligned with the first set of tracks and the second set of roller assemblies disposed on the second cooling unit is vertically aligned with the second set of tracks.

5. The track system of claim 1, wherein the first set of tracks includes a first track disposed on the first row and a second track disposed on the second row.

6. The track system of claim 1, wherein the second set of tracks includes a first track disposed on one side of the at least one cooling unit and a second track disposed on another side of the at least one cooling unit.

7. The track system of claim 1, wherein each roller assembly of the set of roller assemblies includes a pair of rollers.

8. The track system of claim 1, wherein the first set of tracks and the second set of tracks each form a channel having a length, the set of roller assemblies fit into the channel and roll along the length of the channel.

9. A cooling assembly for a data center including a plurality of racks arranged in a first row and in a second row, a space between the first row and the second row forming a hot aisle, the cooling assembly comprising:
   at least one cooling unit;
   a frame assembly configured to support the at least one cooling unit; and
   a track system coupled to the frame assembly, the track system including:
      a first set of tracks supported by the frame assembly,
      a second set of tracks disposed on the at least one cooling unit, and
      at least one set of roller assemblies disposed on the at least one cooling unit, the at least one set of roller assemblies being configured to be received and roll within at least one of the first set of tracks and the second set of tracks.

10. The cooling assembly of claim 9, further including a set of threaded rods mounted to the frame assembly and disposed to suspend the frame assembly from the ceiling.

11. The cooling assembly of claim 9, wherein the frame assembly is positioned over the hot aisle and further includes curtains hanging within the hot aisle from the frame assembly.

12. The cooling assembly of claim 9, wherein the at least one cooling unit includes a first cooling unit having a first set of roller assemblies and a second cooling unit having a second set of roller assemblies, the first cooling unit is configured to roll along the first set of tracks, and the second cooling unit is configured to roll along the second set of tracks.

13. The cooling assembly of claim 12, wherein the first set of roller assemblies disposed on the first cooling unit is vertically aligned with the first set of tracks and the second set of roller assemblies disposed on the second cooling unit is vertically aligned with the second set of tracks.

14. The cooling assembly of claim 9, wherein each roller assembly of the set of roller assemblies includes a pair of rollers.

15. A cooling assembly for a data center including a plurality of equipment racks arranged in a first row and in a second row within a data center, a space between the first row and the second row forming a hot aisle, the cooling assembly comprising:
   at least one cooling unit; and
   a track system supported by the equipment racks of the first row and the second row, the track system including:
      a first set of tracks disposed on the first row of equipment racks and the second row of equipment racks,
      a second set of tracks disposed on the at least one cooling unit, and
      at least one set of roller assemblies disposed on the at least one cooling unit, the at least one set of roller assemblies being configured to be received and roll within at least one of the first set of tracks and the second set of tracks.

16. The cooling assembly of claim 15, wherein the at least one cooling unit is configured to be disposed above the first row of equipment racks and the second row of equipment racks in such a manner that the first cooling unit straddles the hot aisle.

17. The cooling assembly of claim 15, further comprising at least one on-rack support disposed on the first row of equipment racks and the second row of equipment racks, wherein the first set of tracks are mounted on the at least one on-rack support.

18. The cooling assembly of claim 15, wherein each of the at least one set of roller assemblies includes a bracket configured to be secured to the at least one cooling unit and a roller rotatably secured to the bracket.

19. The cooling assembly of claim 18, wherein the roller is rotatably secured to the bracket at an angle with respect to a plane defined by the bracket.

20. The cooling assembly of claim 19, wherein each of the first set and the second set of tracks includes a V-shaped channel formed in the tracks, the arrangement is such that the roller of each of the at least one set of roller assemblies is configured to fit within the channel of the tracks and roll along a length of the tracks.

* * * * *